United States Patent
Kusumoto et al.

(10) Patent No.: US 7,271,042 B2
(45) Date of Patent: *Sep. 18, 2007

(54) LASER ANNEALING METHOD AND LASER ANNEALING DEVICE

(75) Inventors: Naoto Kusumoto, Kanagawa (JP); Shunpei Yamazaki, Tokyo (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/921,872

(22) Filed: Aug. 20, 2004

(65) Prior Publication Data

US 2005/0019997 A1 Jan. 27, 2005

Related U.S. Application Data

(60) Continuation of application No. 10/358,842, filed on Feb. 4, 2003, which is a continuation of application No. 09/796,949, filed on Feb. 27, 2001, now Pat. No. 6,528,359, which is a division of application No. 08/987,573, filed on Dec. 11, 1997, now Pat. No. 6,242,291.

(30) Foreign Application Priority Data

Dec. 12, 1996 (JP) ................................. 8-352140

(51) Int. Cl.
- H01L 21/336 (2006.01)
- H01L 21/84 (2006.01)
- C30B 1/04 (2006.01)
- C30B 28/02 (2006.01)
- B08B 3/04 (2006.01)

(52) U.S. Cl. ............................ 438/166; 117/8; 134/1.3
(58) Field of Classification Search ................ 438/149, 438/166, 471, 473, 474, 795; 117/8; 134/1.3, 134/34, 37
See application file for complete search history.

(56) References Cited

U.S. PATENT DOCUMENTS

| 4,343,829 | A | * | 8/1982 | Tochikubo et al. ............ 117/9 |
| 5,525,550 | A |   | 6/1996 | Kato |
| 5,604,153 | A |   | 2/1997 | Tsubouchi et al. |
| 5,608,232 | A |   | 3/1997 | Yamazaki et al. |
| 5,776,812 | A |   | 7/1998 | Takahashi et al. |
| 5,843,833 | A |   | 12/1998 | Ohtani et al. |
| 5,854,096 | A | * | 12/1998 | Ohtani et al. ............... 438/166 |
| 5,899,709 | A |   | 5/1999 | Yamazaki et al. |
| 5,956,579 | A |   | 9/1999 | Yamazaki et al. |
| 5,956,581 | A | * | 9/1999 | Yamazaki et al. .......... 438/166 |
| 6,027,960 | A | * | 2/2000 | Kusumoto et al. .......... 438/166 |

(Continued)

FOREIGN PATENT DOCUMENTS

JP  60-040683  3/1985

(Continued)

Primary Examiner—M. Wilczewski
(74) Attorney, Agent, or Firm—Fish & Richardson P.C.

(57) ABSTRACT

In order to promote an effect of laser annealing in respect of a semiconductor film, moisture is intentionally included in an atmosphere in irradiating laser beam to the semiconductor film by which a temperature holding layer comprising water vapor is formed on the surface of the semiconductor film in irradiating the laser beam and the laser annealing operation can be performed effectively.

27 Claims, 9 Drawing Sheets

U.S. PATENT DOCUMENTS

| | | | |
|---|---|---|---|
| 6,061,375 A | 5/2000 | Zhang et al. | |
| 6,066,516 A | 5/2000 | Miyasaka | |
| 6,071,796 A * | 6/2000 | Voutsas | 438/487 |
| 6,093,243 A * | 7/2000 | Okada et al. | 117/8 |
| 6,124,154 A | 9/2000 | Miyasaka | |
| 6,242,291 B1 * | 6/2001 | Kusumoto et al. | 438/158 |
| 6,255,148 B1 * | 7/2001 | Hara et al. | 438/166 |
| 6,329,269 B1 * | 12/2001 | Hamada et al. | 438/486 |
| 6,348,369 B1 * | 2/2002 | Kusumoto et al. | 438/166 |
| 6,528,359 B2 * | 3/2003 | Kusumoto et al. | 438/151 |
| 6,580,053 B1 * | 6/2003 | Voutsas | 219/121.66 |
| 6,927,419 B2 * | 8/2005 | Hara et al. | 257/64 |
| 7,041,580 B2 * | 5/2006 | Kusumoto et al. | 438/487 |
| 2002/0153360 A1 | 10/2002 | Yamazaki et al. | |
| 2004/0099220 A1 * | 5/2004 | Tsao | 118/729 |
| 2004/0106242 A1 * | 6/2004 | Arao et al. | 438/166 |
| 2004/0224446 A1 * | 11/2004 | Yeh | 438/166 |
| 2005/0019997 A1 * | 1/2005 | Kusumoto et al. | 438/166 |
| 2005/0020096 A1 * | 1/2005 | Miyairi et al. | 438/795 |
| 2005/0112850 A1 * | 5/2005 | Yamazaki et al. | 438/487 |
| 2005/0236692 A1 * | 10/2005 | Hara et al. | 257/604 |
| 2005/0257738 A1 | 11/2005 | Tateishi et al. | |
| 2006/0030131 A1 * | 2/2006 | Richardson et al. | 438/482 |
| 2006/0051903 A1 * | 3/2006 | Kunii | 438/142 |
| 2006/0079040 A1 * | 4/2006 | Tanaka et al. | 438/166 |
| 2006/0118036 A1 * | 6/2006 | Takeda et al. | 117/89 |
| 2006/0183276 A1 * | 8/2006 | Yamazaki et al. | 438/166 |
| 2006/0252186 A1 * | 11/2006 | Nakajima et al. | 438/149 |

FOREIGN PATENT DOCUMENTS

| | | | |
|---|---|---|---|
| JP | 60-041266 | | 3/1985 |
| JP | 1-231315 | * | 9/1989 |
| JP | 2-196098 | * | 8/1990 |
| JP | 06-244104 | | 2/1994 |
| JP | 07-201876 | | 8/1995 |
| JP | 07-283151 | | 10/1995 |
| JP | 07-307286 | | 11/1995 |
| JP | 11-8205 | * | 1/1999 |
| JP | 2002-75904 | * | 3/2002 |
| KR | 2004-024758 | * | 3/2004 |

* cited by examiner

LASER ANNEALING METHOD AND LASER ANNEALING DEVICE

CROSS-REFERENCE TO RELATED APPLICATIONS

This application is a continuation application of U.S. application Ser. No. 10/358,842, filed Feb. 4, 2003, now allowed, which is a continuation of U.S. application Ser. No. 09/796,949, filed Feb. 27, 2001, now U.S. Pat. No. 6,528, 359, which is a divisional of U.S. application Ser. No. 08/987,573, filed Dec. 11, 1997, now U.S. Pat. No. 6,242, 291, which claims the benefit of a foreign priority application filed in Japan as Ser. No. 08-352140 on Dec. 12, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a method of crystallizing an amorphous silicon film or a crystalline silicon film formed on an insulating substrate of glass or the like or promoting crystalline performance thereof by performing laser annealing thereto.

2. Description of Prior Art

In recent years researches have widely been carried out on the technology of crystallizing an amorphous semiconductor film or a crystalline semiconductor film (semiconductor film having crystalline performance constituted not by single crystal but polycrystal, microcrystal or the like), that is, a non single crystal silicon film formed on an insulating substrate of glass or the like or promoting the crystalline performance by performing laser annealing in respect of the film. A silicon film is frequently used for the semiconductor film.

Compared with a quartz substrate which has been frequently used conventionally, a glass substrate has an advantage where the substrate is inexpensive and superior in fabrication performance and a substrate having a large area can easily be formed. Further, laser is preferably used in crystallization process since the melting point of the glass substrate is low. Laser can impart high energy only to a non single crystal film without considerably changing temperature of a substrate.

A crystalline silicon film formed by performing laser annealing is provided with high mobility. Further, researches have been carried out on the technology of forming a thin film transistor (TFT) by using the crystalline silicon film. According to the technology, a liquid crystal electro-optic device of a monolithic type where TFTs for pixel driving and for drive circuit are fabricated on one sheet of a glass substrate, can be provided. The crystalline silicon film is constituted by a number of crystal grains and therefore, the film is referred to generally as a polycrystalline silicon film or a polycrystalline semiconductor film.

Further, a method of performing laser annealing by fabricating a pulse laser beam of an excimer laser or the like having a large output into a square spot of several cm square or a linear shape of several mm width×several tens cm on an irradiated face by an optical system and scanning the laser beam (moving an irradiation position of the laser beam relatively in respect of the irradiated face), is preferably used since the method is provided with excellent mass production performance and is industrially excellent.

Particularly, when the linear laser beam is used, high mass production performance can be provided since laser irradiation can be carried out over the entire irradiated face by scanning the laser only in a direction orthogonal to the line direction different from a case of using a laser beam in a spot-like shape where scanning in the forward and rearward direction and in the left and right direction is needed.

Several problems have been posed in performing laser annealing in respect of a non single crystal silicon film by scanning a laser beam of a spot-like shape or a linear shape with a pulse laser beam as a light source.

A particularly serious problem is nonuniformity of effect of laser irradiation in a substrate face. As feature of laser beam, although provision of large energy is pointed out as the most preferable advantage, on the other hand, the pulse laser is provided with a drawback where dispersion of energy for respective shots of pulses is as large as several percent. According to the drawback, when, for example, a liquid crystal display is formed by crystallizing an amorphous silicon film by an excimer laser, there causes an inconvenience where trace of pulse of laser is visualized as it is on picture image.

Such an image failure constitutes a serious drawback in the present age where beautiful picture image is needed. The present invention has been carried out with an object of making inconspicuous or completely eliminating the drawback.

SUMMARY OF THE INVENTION

In order to solve the above-described problem, the inventors have paid attention to an atmosphere of a substrate in irradiating laser, performed laser irradiation under various kinds of atmosphere and investigated differences therebetween.

An amorphous silicon film in which the concentration of hydrogen was controlled was selected as an object of laser irradiation. The hydrogen concentration of a film was set to an order of $10^{20}$ atoms/cm$^3$. An excimer laser was used for the laser. The result is shown below.

High energy was needed for crystallizing the film when laser irradiation was performed in an atmosphere of a gas having low thermal conductivity such as nitrogen. Meanwhile, when laser irradiation was performed under a state in which a substrate was subjected to an atmosphere of a gas having high thermal conductivity such as hydrogen or helium, a film having high crystalline performance was obtained by comparatively low energy. Further, the temperature of the substrate in laser irradiation was varied in a range of 200° C. through 400° C. Although comparatively low laser energy was used when the temperature was high, the homogeneity was deteriorated.

The laser irradiation under the atmosphere of the above-described gases only gave rise to a variation in optimum laser energy for crystallization and the homogeneity was not promoted. However, when oxygen was mixed to the atmosphere or only oxygen was used in the atmosphere, the situation was significantly changed. The optimum energy for crystallization was significantly reduced and further, the homogeneity of the film after laser irradiation was also promoted.

It was found from the above-described experiment that oxygen was very effective in promoting the homogeneity and in reducing the optimum laser energy for crystallization. In FIG. 2, an investigation was conducted on the crystalline performance of the substrate in view of half width of Raman half value by varying the atmosphere and the laser energy.

The lower the value of the half width of Raman half value, the more excellent is the crystalline performance and therefore, the effect of mixing oxygen is quite apparent. Further, it was found by the above-described experiment that the lower the temperature, the more promoted was the homogeneity. Incidentally, the abscissa designates the energy density (mJ/cm$^2$) and the ordinate designates the half width of Raman half value (cm$^{-1}$).

Oxygen was particularly effective in laser crystallization when the temperature of the substrate was lowered to the room temperature. Under an atmosphere of a gas not including oxygen, at room temperature, enormous laser energy was needed in crystallization by which the productivity was deteriorated significantly. Further, even in the temperature region of 200° C. or lower, the lower the temperature, the more improved was the homogeneity. The data is shown in FIG. 4.

FIG. 4 is viewed as follows. According to FIG. 4, the abscissa designates the energy density (mJ/cm$^2$) and the ordinate designates the mean roughness (Ra, nm) in which the state of film roughness is evaluated by an AFM (Atomic Force Microscope) by the laser energy when the atmosphere of the chamber is brought into an atmosphere of the earth, and temperature of the substrate is varied to room temperature, 200° C. and 400° C. The lower the temperature of the substrate, the higher becomes laser energy necessary for crystallization and therefore, the laser energy is varied such that the crystalline performance having the same degree is obtained at either of the films where the temperature of the substrate is at room temperature, 200° C. and 400° C. Therefore, the lower the temperature of the substrate, the higher the energy whereby the laser is irradiated.

It is read from the data that the higher the temperature of the substrate, the larger the change in mean roughness of the surface of the film derived from a variation in the laser energy. Accordingly, when a laser having a large amount of variation in the laser energy is used for crystallizing the film, the lower the temperature of the substrate, the more reduced is the in-face dispersion of the mean roughness at the surface of the film. The roughness of the surface of the film has a correlation with the crystalline performance of the film and when the roughness is uniform, the crystalline performance is also uniform.

Photographs clarifying the behavior are prepared in FIGS. 7(A), 7(B) and 7(C). When the film face is roughened by laser irradiation, the film is brightened. The degree of the brightness and the degree of the roughness of the film are correlated with each other and when the degree of the brightness stays the same, the degree of the roughness of the film face also stays the same. FIGS. 7(A), 7(B) and 7(C) are photographs of surfaces when amorphous silicon films are subjected to laser annealing by an excimer laser in which the beam is fabricated in a linear shape. The linear laser is irradiated to the films while scanning from top to bottom direction in the photographs.

In order to search for the optimum energy for crystallization, the laser energy was increased toward the upper direction of the substrate (upper direction in respect of paper face). (Varied by a unit of 5 mJ/cm$^2$) Lengthwise fringes seen in the films are optical interference fringes formed by groups of lenses (refer to FIG. 8) for fabricating the laser beam in a linear shape. When the optical interference fringes are inconspicuous, the homogeneity of crystals is improved.

In FIG. 7(A), a laser processing is performed on the surface of a silicon film at the temperature of substrate of 400° C. in an atmospheric environment in a state where the surface of the silicon film is cleaned by an aqueous solution including HF and H$_2$O$_2$ by which the film surface is positively terminated by hydrogen. The laser energy is varied in a range of 255 through 310 mJ/cm$^2$. (The surface energy is varied at intervals of 5 mJ/cm$^2$.)

In FIG. 7(B), the laser processing is performed at room temperature in an atmospheric environment in the same state of the film surface as in FIG. 7(A). The laser energy is varied in a range of 315 through 370 mJ/cm$^2$. (The Laser energy is varied at intervals of 5 mJ/cm$^2$.)

In FIG. 7(C), the laser processing is performed at room temperature in an atmospheric environment in a state where an extremely thin natural oxide is formed on the surface of the silicon film, that is, the surface of the silicon film is not particularly processed. The laser energy is varied in a range of 300 through 355 mJ/cm$^2$. (The laser energy is varied at intervals of 5 mJ/cm$^2$.)

The range of the laser energy differs among the photographs (A), (B) and (C) because the optimum energy for crystallization is varied depending on the state of the film face.

By comparing the photographs (A), (B) and (C), it is found that the photograph (B) is provided with a region of a laser energy for making uniform mostly the brightness of the film surface. (That is, the nonuniformity of film quality is inconsiderable.)

A sixth region from above the photograph (B) corresponds thereto. The film of the photograph (B) is formed by performing laser irradiation at room temperature in an atmospheric environment in the state where the film surface is positively terminated by hydrogen.

A result is obtained in the experiment such that an atmosphere including oxygen is effective in promoting the homogeneity of laser crystallization and the effect is enhanced by positively terminating the surface of the silicon film by hydrogen in the atmosphere and when the temperature of the substrate is selected in the temperature of room temperature through 400° C., the room temperature is found to be at optimum.

The thermal conductivity of oxygen is comparatively low among gases and is almost the same as the thermal conductivity of nitrogen. However, why is such a difference caused? The inventors have considered that there must be some chemical change and established the following hypothesis.

The surface of the silicon film before the laser crystallization is generally terminated by hydrogen. Therefore, when the laser crystallization is performed in an atmosphere including oxygen (may be in an atmospheric environment), oxygen reacts with hydrogen on the surface of silicon by the laser energy by which water molecules are formed.

The formed water molecules are distributed on the surface of the substrate in a form of a thin layer in a gaseous state, a liquid state or a state where gas and liquid are coexistent and serve as a heat insulating layer restraining the diffusion rate of heat from the substrate in laser crystallization. When the laser crystallization is performed while heating the substrate, even if a water molecule layer is formed, the layer is swiftly diffused and therefore, the heat insulating effect of the water molecule layer is difficult to cause. Occurrence and extinction of the water molecule layer is repeated along with the laser irradiation.

Assuming that the above-described hypothesis is correct, the inventors have provided intentionally the water molecule layer directly on the silicon film in the laser crystallization and performed the laser crystallization. The method of forming the water molecule layer is as follows.

First Method:

The surface of silicon is intentionally and positively terminated by hydrogen.

For example, when the upper face of a non single crystal silicon film is cleaned by an aqueous solution including HF, or an aqueous solution including HF and $H_2O_2$ before performing the laser crystallization, the rate of termination by hydrogen on the surface of the silicon film is significantly increased. When the above-described hypothesis is correct, the amount of forming water molecules in the laser irradiation is increased by an increase in the amount of hydrogen on the silicon surface and the temperature maintaining effect is promoted. Naturally, in this case, the laser irradiation is performed in an atmosphere including oxygen. The effect of the method has been verified by FIGS. 7(A), 7(B) and 7(C).

Second Method:

Laser crystallization is performed by conducting nitrogen purge added with moisture. Specifically, a portion or all of nitrogen gas is subjected to bubbling in water and is sent to the laser irradiation chamber. When the effect of promoting the homogeneity can be confirmed by this method, the temperature maintaining effect of the water molecule layer can be confirmed.

Third Method:

The laser crystallization is performed by conducting nitrogen purge added with oxygen and hydrogen. The amount of hydrogen has been set to about 0.1% through 10% in consideration of the safety. This method intends to provide water molecules by synthesizing gaseous oxygen and hydrogen by the laser energy.

The second and the third methods have achieved an effect comparable to or more than that in the first method. Therefore, it has been found that provision of the water molecule layer directly above the semiconductor film is effective in promoting the homogeneity of crystal.

In the case where the laser beam fabricated in a linear shape is used as a laser of the laser crystallization, when a gas flow in an air knife shape (hereinafter, referred to as air knife) is formed by the purge gas and the laser irradiation is performed while impinging the gas flow to a portion where the laser is being irradiated, more water molecules are supplied and the effect is promoted. A similar effect is achieved even when the air knife is not made to impinge directly the laser-irradiated portion so far as the air of the air knife is sufficiently supplied to above the portion of the film where the laser is irradiated. However, according to the second and third methods, when the amount of added moisture or the amount of oxygen and hydrogen is excessively large, an adverse effect is resulted.

Generally, a beam having a short wavelength as in an excimer laser does not penetrate a certain depth or more of water and therefore, it is anticipated that when water molecules of the water molecule layer form an aggregation exceeding a certain density, the effect of the laser irradiation is significantly reduced. The adverse effect explains well of the phenomenon.

According to the above-described methods, the in-face homogeneity of the crystalline substrate is significantly promoted by any of them and traces of pulses of the laser are made almost inconspicuous. A particularly excellent point of the methods resides in that grain sizes of crystals are distributed around a range of 2000 Å through 3000 Å. The dispersion of sizes of the grain sizes of the crystals is as small as ±20% or smaller in σ (Standard Deviation). FIGS. 9(A) and 9(B) show photographs visualizing the behavior.

FIG. 9(A) is an SEM photograph (Scanning Electrode Microscope photograph) of the surface of the silicon film in which a substrate where terminations of hydrogen are intentionally provided on the surface of an amorphous silicon film is subjected to laser irradiation at room temperature (RT) in an atmospheric environment.

FIG. 9(B) is an SEM photograph of the surface of a film subjected to laser irradiation with conditions the same as those in FIG. 9(A) except the temperature of the substrate that is set to 400° C. According to the film on which the laser irradiation is performed in a state where the temperature of the substrate is as high as 400° C., the grain sizes are distributed in a wide range from as large as μm order to as small as several hundreds Å. Meanwhile, in the case of the film on which the laser irradiation is performed where the temperature of the substrate is at room temperature, the grain sizes are provided with a distribution having a peak in a comparatively narrow range of 2000 Å through 3000 Å. The fact indicates that the grain sizes are distributed uniformly when the laser crystallization is performed under conditions whereby the layer of water molecules formed by the laser irradiation is difficult to diverge.

Further, the dispersion in height of irregularities on the surface of the semiconductor film caused by the laser irradiation becomes smaller than in the conventional case. The fact is indicated by FIG. 4. It is known that the energy of a pulse laser is varied by ±5% in the case of an excimer laser. The variation of 5% of the energy density that is actually irradiated corresponds to about 10 through 20 $mJ/cm^2$ in FIG. 4. When the energy density is varied by the width of 10 through 20 $mJ/cm^2$, the mean roughness is varied by ±70% or more at the temperature of the substrate of 400° C. whereas it is confined to ±40% or less when the temperature of the substrate is room temperature. These numerical values coincide substantially with the value of σ calculated by performing a statistical treatment on the irregularities of the substrate.

The present invention disclosed in the specification has been obtained from the above-described experimental result.

According to a first aspect of the present invention, there is provided a method of performing laser annealing by irradiating a laser beam to a non single crystal semiconductor film:

wherein the laser beam is irradiated while forming a temperature holding layer of heat of a gas or a liquid on a side of a face irradiated with the laser beam.

The temperature holding layer helps promote to crystallize the non single crystal semiconductor film by maintaining the temperature of the non single crystal semiconductor film.

The effect of the temperature holding layer is promoted when it comprises water or water vapor. Because water is one of substances having the largest heat capacity in fluids. It is preferable that the temperature holding layer comprises water or water vapor promoting to crystallize the non single crystal semiconductor film.

According to a second aspect of the present invention, there is provided a method of performing laser annealing by irradiating a laser beam to a non single crystal semiconductor film:

wherein the laser beam is irradiated in a state where oxygen and hydrogen are distributed at least at a vicinity of an inside and an outside of a surface of the semiconductor film and oxygen and hydrogen are made to react with each other by the laser beam by which water is formed simultaneously with crystallizing the semiconductor film.

According to a third aspect of the present invention, there is provided a method of performing laser annealing by irradiating a laser beam fabricated in a linear shape to a non single crystal semiconductor film:

wherein the laser beam is irradiated while forming a temperature holding layer of heat of a gas or a liquid on a side of a face irradiated with the laser beam.

The temperature holding layer helps promote to crystallize the non single crystal semiconductor film by maintaining the temperature of the non single crystal semiconductor film.

When the temperature holding layer comprises water or water vapor, the effect is promoted. Because water is one of substances having the largest heat capacity in fluids.

It is preferable that the temperature holding layer comprises water or water vapor promoting to crystallize the non single crystal semiconductor film.

According to a fourth aspect of the present invention, there is provided a method of performing laser annealing by irradiating a laser beam fabricated in a linear shape to a non single crystal semiconductor film:

wherein the laser beam is irradiated in a state where oxygen and hydrogen are distributed at least at a vicinity of an inside and an outside of a surface of the semiconductor film by which oxygen and hydrogen are made to react with each other by the laser beam whereby water is formed simultaneously with crystallizing the semiconductor film.

A pulse laser is effective for the laser used in the first through fourth aspects of the present invention. An excimer laser having a particularly large output in the pulse laser is effective for the laser used in the first through fourth aspects of the present invention.

According to a fifth aspect of the present invention, there is provided a method of performing laser annealing by irradiating a laser beam to a non single crystal semiconductor film:

wherein the laser beam is irradiated to the non single crystal semiconductor film in an atmosphere including at least oxygen and under a state where a surface of the non single crystal semiconductor film is intentionally terminated by hydrogen.

According to a sixth aspect of the present invention, there is provided a method of performing laser annealing by irradiating a laser beam to a non single crystal semiconductor film:

wherein an inside of a laser irradiation chamber capable of controlling an atmosphere thereof is brought into an atmosphere including at least water molecules and the laser beam is irradiated to the non single crystal semiconductor film in the laser irradiation chamber.

According to a seventh aspect of the present invention, there is provided a method of performing laser annealing by irradiating a laser beam to a non single crystal semiconductor film;

wherein the laser beam is irradiated to the non single crystal semiconductor film in a laser irradiation chamber in a state where an inside of the laser irradiation chamber capable of controlling an atmosphere thereof is brought into an atmosphere including at least oxygen and hydrogen by which oxygen and hydrogen are made to react with each other by the laser beam and water is formed simultaneously with crystallizing the semiconductor film.

When the above-described non single crystal semiconductor film is brought into a state where the surface of the non single crystal semiconductor film is intentionally terminated by hydrogen before the laser irradiation, the laser crystallization is carried out further uniformly in the film face. This is because synthesizing of water is performed at a vicinity of the film face, resulting in expediting the temperature maintaining effect.

According to an eighth aspect of the present invention, there is provided a method of performing laser annealing by irradiating a laser beam to a non single crystal semiconductor film:

wherein the laser beam is irradiated to the non single crystal semiconductor film while forming a layer constituted by water molecules in a range from a surface of the non single crystal semiconductor film to just the vicinities of the surface.

According to a ninth aspect of the present invention, there is provided a method of performing laser annealing by irradiating a laser beam to a non single crystal semiconductor film:

wherein the laser beam is irradiated to the non single crystal semiconductor film in a state where a layer constituted by water molecules is formed in a range of from a surface of the non single crystal semiconductor film to just the vicinities of the surface.

In either of the above-described laser annealing processes, when it is carried out in a state where the temperature of the substrate is maintained in a range of −10° C. through 100° C., the crystalline performance of the film is promoted to be made further uniform.

According to a tenth aspect of the present invention, there is provided a method of performing laser annealing by irradiating a laser beam to a non single crystal semiconductor film:

wherein the laser beam is irradiated to the non single crystal semiconductor film while blowing a gas including water molecules to the non single crystal semiconductor film.

According to an eleventh aspect of the prevent invention, there is provided a method of performing laser annealing by irradiating a laser beam to a non single crystal semiconductor film:

wherein the laser beam is irradiated to the non single crystal semiconductor film while blowing a gas including oxygen and hydrogen to the non single crystal semiconductor film.

In respect of the tenth or the eleventh aspect of the present invention, when laser annealing is carried out in a state where the temperature of the substrate is maintained in a range of −10° C. through 100° C., the crystalline performance of the film can be promoted to be made further uniform.

The laser annealing process according to the tenth or the eleventh aspect of the present invention, achieves an effect in preventing contamination when the process is carried out in a laser irradiation chamber capable of controlling an atmosphere thereof. Particularly, in respect of the eleventh aspect of the present invention, hydrogen is used and therefore, laser irradiation chamber is needed for safety.

In either of the fifth through the eleventh aspects of the present invention, the irradiation of the laser beam is preferably carried out by scanning a laser beam having a sectional shape of an irradiated face in a spot-like shape or a linear shape. A pulse laser is effective in respect of the laser used in the fifth through the eleventh aspects of the present invention. An excimer laser having particularly large output in the pulse laser is effective for a laser used in the fifth through the eleventh aspects of the present invention.

According to a twelfth aspect of the present invention, there is provided a method of performing laser annealing by irradiating a laser beam which is fabricated in a linear shape to a non single crystal semiconductor film:

wherein a gas flow in an air knife shape is formed by a gas including water molecules and while blowing the gas flow in the air knife shape to the non single crystal semiconductor film, the laser beam is irradiated to a portion of the non single crystal semiconductor film to which the gas flow in the air knife shape is blown.

According to a thirteenth aspect of the present invention, there is provided a method of performing laser annealing by irradiating a laser beam which is fabricated in a linear shape to a non single crystal semiconductor film:

wherein a gas flow in an air knife shape is formed by a gas including oxygen and hydrogen and while blowing the gas flow in the air knife shape to the non single crystal semiconductor film, the laser beam is irradiated to a portion of the non single crystal semiconductor film to which the gas flow in the air knife shape is blown.

The reason of forming the gas flow in the air knife shape in respect or the twelfth and the thirteenth aspects of the present invention, is that the section of the air knife resembles with the beam shape of the linear laser beam and therefore, the gases can be supplied efficiently to a portion where the laser is irradiated. In respect of the twelfth and the thirteenth aspects of the present invention, when the laser annealing is performed in a state where the temperature of the substrate is maintained in a range of −10° C. through 100° C., the crystalline performance of the film is promoted to be made further uniformly.

In respect of the twelfth and the thirteen aspects of the present invention, when the laser annealing process is carried out in a laser irradiation chamber capable of controlling an atmosphere thereof, an effect is achieved in preventing contamination. Particularly, in the thirteenth aspect of the present invention, hydrogen is used and therefore, the laser irradiation chamber is needed for safety.

A pulse laser is effective for the laser used in the twelfth and the thirteenth aspects of the present invention. An excimer laser having a particularly large output in the pulse laser is effective for the laser used in the twelfth and the thirteenth aspects of the present invention.

A non single crystal silicon film is suitable for the non single crystal semiconductor film used in the first through the thirteenth aspects of the present invention.

According to a fourteenth aspect of the present invention, there is provided a laser annealing device for performing laser annealing to a non single crystal semiconductor film in a laser irradiation chamber capable of controlling an atmosphere thereof, said device comprising:

means for supplying a gas including at least water molecules into the laser irradiation chamber.

According to a fifteenth aspect of the present invention, there is provided a laser annealing device for performing laser annealing to a non single crystal semiconductor film in a laser irradiation chamber capable of controlling an atmosphere thereof, said device comprising:

means for supplying a gas including at least hydrogen and oxygen into the laser irradiation chamber.

According to a sixteenth aspect of the present invention, there is provided a laser annealing device for performing laser annealing to a non single crystal semiconductor film, said device comprising:

means for supplying a gas including at least water molecules to a portion of the non single crystal semiconductor film to which a laser beam formed by the laser annealing device is irradiated.

According to a seventeenth aspect of the present invention, there is provided a laser annealing device for performing laser annealing to a non single crystal semiconductor film, said device comprising:

means for supplying a gas including at least hydrogen and oxygen to a portion of the non single crystal semiconductor film to which a laser beam formed by the laser annealing device is irradiated.

According to an eighteenth aspect of the present invention, there is provided a laser annealing device for forming a laser beam which is fabricated in a linear shape for performing laser annealing to a non single crystal semiconductor film, said device comprising:

means for forming a gas flow in an air knife shape by a gas including at least water molecules; and means for supplying the gas forming the gas flow in the air knife shape to a portion of the non single crystal semiconductor film to which the laser beam formed by the laser annealing device is irradiated.

According to a nineteenth aspect of the present invention, there is provided a laser annealing device for forming a laser beam which is fabricated in a linear shape for performing laser annealing to a non single crystal semiconductor film, said device comprising:

means for forming a gas flow in an air knife shape by a gas including at least hydrogen and oxygen; and means for supplying the gas forming the gas flow in the air knife shape to a portion of the non single crystal semiconductor film to which the laser beam formed by the laser annealing device is irradiated.

A pulse laser is suitable for a laser of the fourteenth through the nineteen aspects of the present invention. An excimer laser having a particularly large output in the pulse laser is suitable for the laser of the eighteenth and the nineteenth aspects of the present invention. A non single crystal silicon film is suitable for the non single crystal semiconductor film used in the fourteenth through the nineteenth aspects of the present invention.

In either of the above-described aspects of the present invention, nitrogen gas is suitable as other component of the above-described gases in view of cost, low reactivity and the like.

According to the present invention, in crystallizing or promoting crystalline performance of a non single crystal semiconductor film by performing laser annealing on the film, a layer of water molecules is formed between the non single crystal semiconductor film and a laser beam. A layer of water molecules operates the non single crystal semiconductor film as a temperature holding layer and significantly promotes homogeneity of the crystalline performance in a film face.

As mentioned above, the effect of the layer of water molecules is varied significantly by the density of the water molecules. This is because a beam having a short wavelength does not penetrate water in a liquid state by a certain depth or more. A laser beam is provided with a short wavelength since it is an ultraviolet ray.

DETAILED DESCRIPTION OF THE PREFERRED EMBODIMENTS

Embodiment 1

Figure 1:
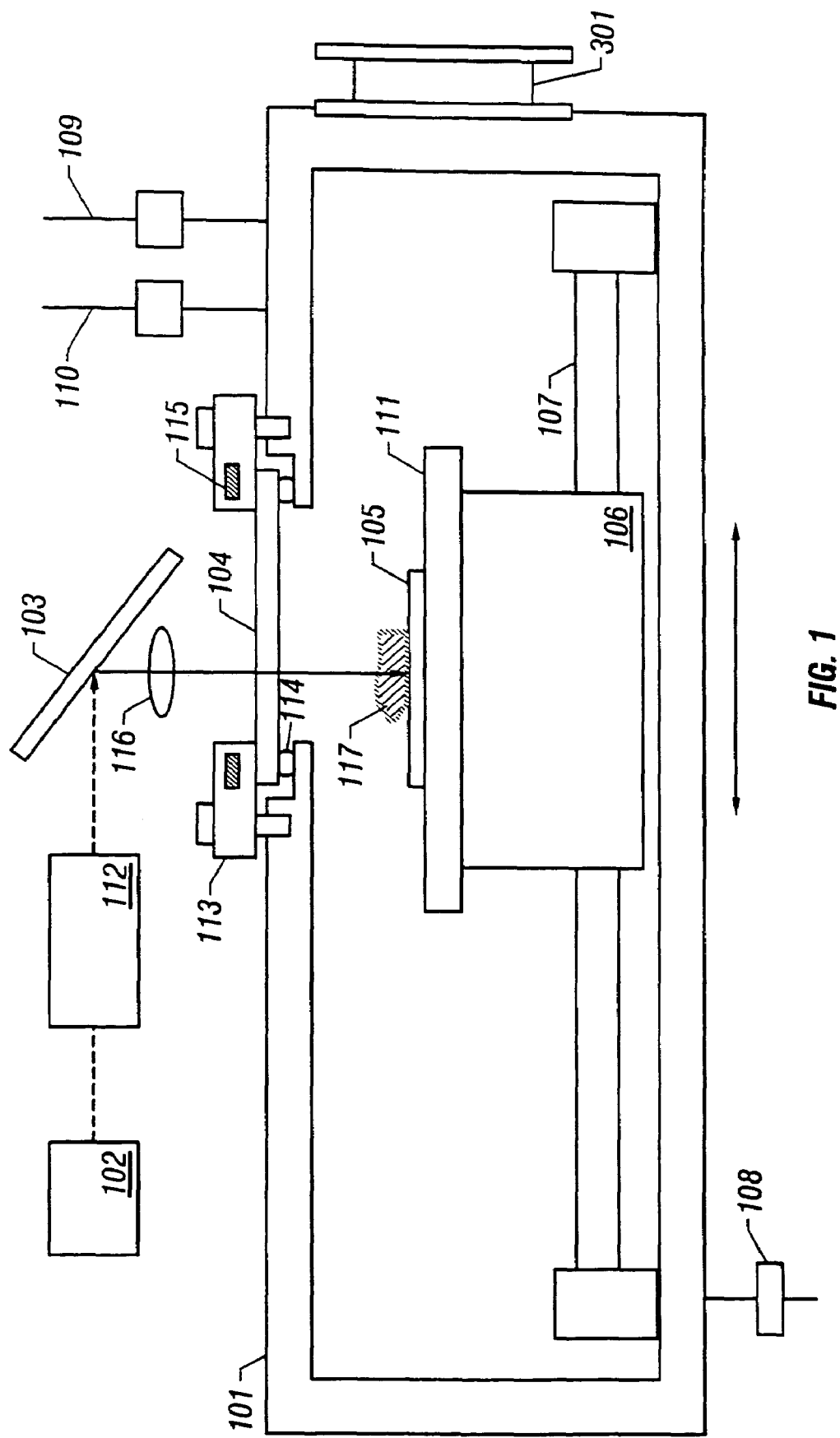
FIG. 1 is a view showing a laser irradiation chamber according to an embodiment.
Figure 2:
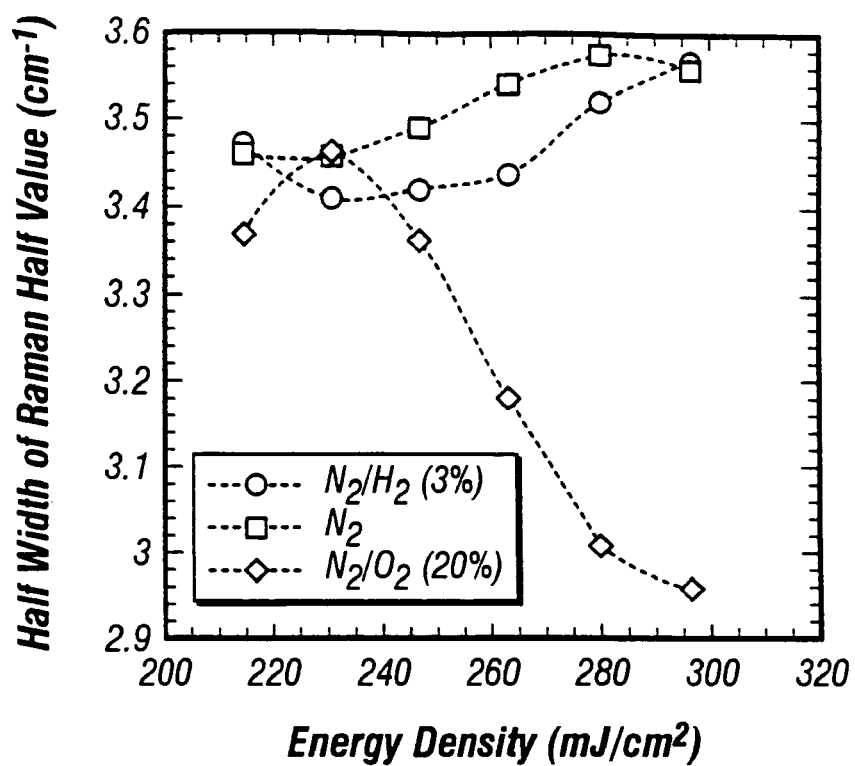
FIG. 2 is a diagram showing a relationship between an energy density of a laser beam and a half width of Raman half value of a crystalline silicon film which has been subjected to laser annealing in laser annealing in various atmospheres.

A method of forming a film for laser irradiation will firstly be shown in accordance with fabrication steps of the embodiment. There are three kinds of films for laser irradiation according to the specification. The present invention is effective in respect of either of the films.

Firstly, for all the three kinds of films, 2000 Å of a silicon oxide film as an underlayer is formed on a substrate of Corning 1737 of 127 mm square and 500 Å of an amorphous silicon film is formed thereon continuously both by a plasma CVD (Chemical Vapor Deposition) process. Hereinafter, the films are referred to as a starting film.

Fabrication Procedure of Film A:

Firstly, the starting film is subjected to a hot bath at 450° C. for 1 hour. This step is a step for reducing hydrogen concentration in the amorphous silicon film. The step is included in the process since the film cannot stand laser energy when the amount of hydrogen in the film is excessively large.

The density of hydrogen in the film is preferably in an order of $10^{20}$ atoms/cm$^3$. The film is referred to as a non single crystal silicon film A.

Fabrication Procedure of Film B:

Firstly, an aqueous solution of 10 ppm nickel acetate is coated on the starting film by a spin coating process by which a nickel acetate layer is formed. It is more preferable to add a surfactant to the aqueous solution of nickel acetate. Although the nickel acetate layer is not necessarily in a film-like shape since it is extremely thin, no problem is posed in later steps.

Next, thermal annealing at 600° C. for 4 hours is performed on the substrate laminated with the respective films as mentioned above, the amorphous silicon film is crystallized and a crystalline silicon film B that is a non single crystal silicon film is formed.

In this case, nickel that is a catalyst element serves as nuclei of crystal growth and expedites crystallization. By the function of nickel crystallization can be carried out at a low temperature of 600° C. for a short period of 4 hours. The details are described in Unexamined Published Japanese Patent Application No. 6-244104.

It is preferable that the concentration of a catalyst element falls in a range of $1 \times 10^{15}$ through $10^{19}$ atoms/cm$^3$. At a high concentration of $1 \times 10^{19}$ atoms/cm$^3$ or more, metallic properties are provided to a crystalline silicon film and properties as a semiconductor are lost.

According to the embodiment, the concentration of a catalyst element in a crystalline silicon film falls in a range of $1 \times 10^{17}$ through $5 \times 10^{18}$ atoms/cm$^3$ as a minimum value in the film. These values are analyzed and measured by a Secondary Ion Mass Spectrometry (SIMS).

Fabrication Procedure of Film C:

First, 700 Å of a silicon oxide film is formed on the starting film. A plasma CVD process is used for the film forming process. Next, portions of the silicon oxide film are completely perforated by a photolithography patterning step. UV (Ultra Violet) ray is irradiated for 5 minutes in an oxygen atmosphere to form a thin oxide film at the perforated portions. The thin film is formed for improving wettability of the perforated portions in respect of an aqueous solution of nickel acetate that is to be introduced in a later step.

100 ppm of an aqueous solution of nickel acetate is coated on the film by a spin coating process by which nickel acetate enters the perforated portions. It is more preferable to add a surfactant to the aqueous solution of nickel acetate.

Next, thermal annealing is conducted at 600° C. for 8 hours by which crystals are grown in the horizontal direction from portions where nickel has been introduced. In this case, the role achieved by nickel is similar to that in the film B. Under conditions of this case, about 40 μm of a horizontal growth amount is provided. In this way, the amorphous silicon film is crystallized and a crystalline silicon film C that is a non single crystal silicon film is formed. Thereafter, the silicon oxide film on the crystalline silicon film is stripped and removed by using buffer hydrofluoric acid.

Laser annealing is performed by using a excimer laser in order to crystallize the non single crystal silicon films A, B and C provided in this way or promoting further the crystalline performance.

FIG. 1 shows a laser irradiation chamber according to the embodiment. FIG. 1 is a side sectional view of the laser irradiation chamber.

Figure 3:
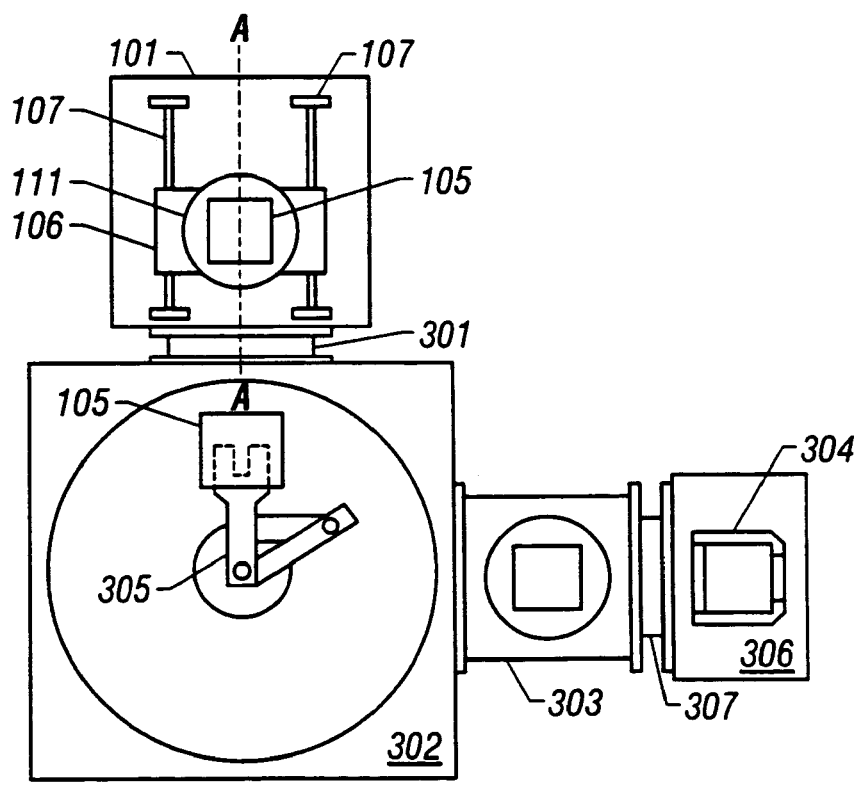
FIG. 3 is a top view of a laser annealing device according to an embodiment.
Figure 4:
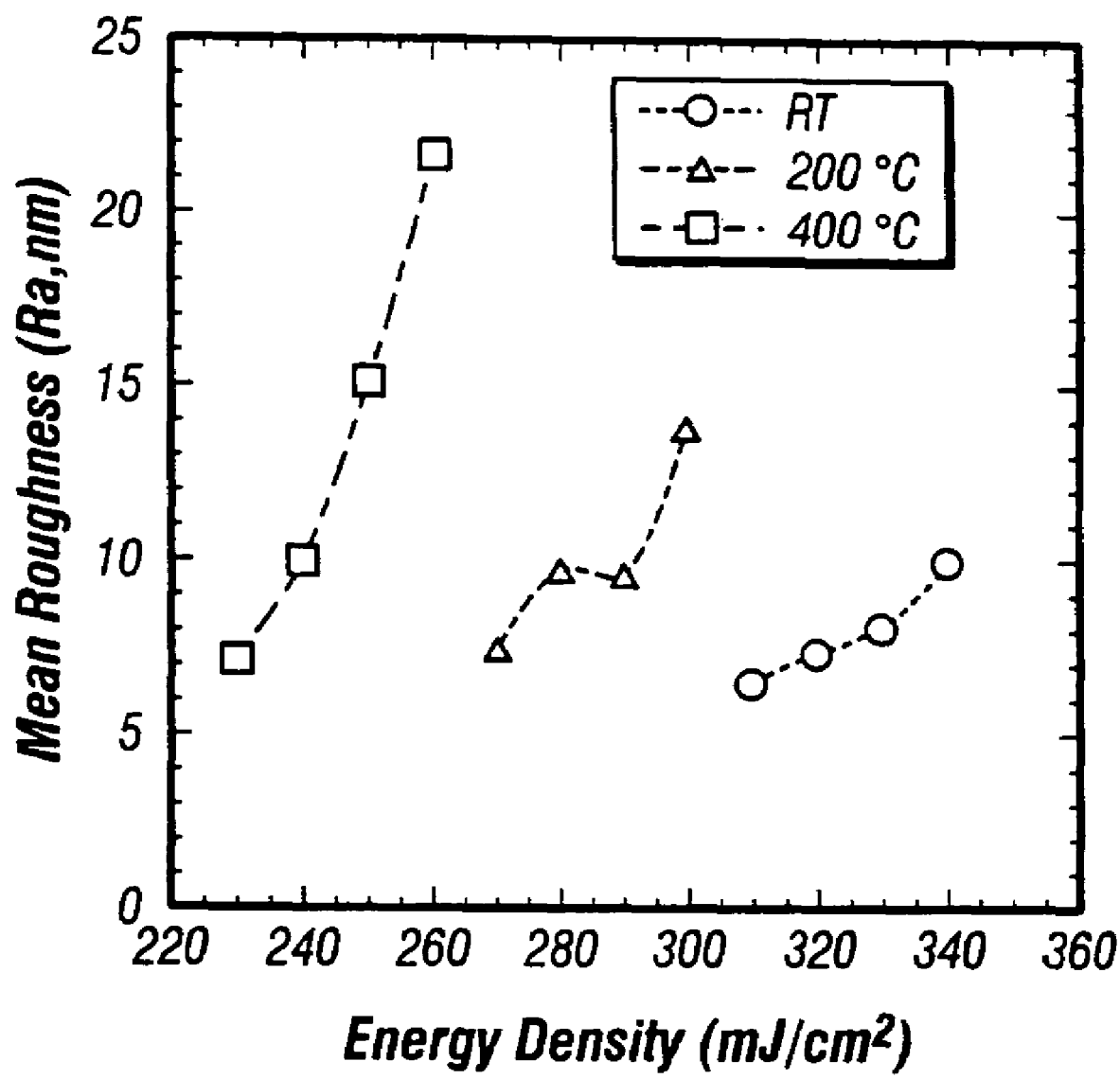
FIG. 4 is a diagram showing a relationship between an energy density of a laser beam and surface mean roughness of a crystalline silicon film which has been subjected to laser annealing in laser annealing at various temperatures.

FIG. 3 shows a top view of a laser annealing device according to the embodiment. In this case, the laser annealing device of a multi chamber type shown in FIG. 3 is used. A view showing a section of A-A' in FIG. 3 corresponds to FIG. 1.

In FIG. 1, a laser irradiation chamber 101 is provided with a function of reflecting a pulse laser beam which is irradiated from a laser oscillating device 102 and a sectional shape of which is fabricated in a linear shape by an optical system 112 by a mirror 103, condensing the pulse laser beam by a cylindrical lens 116 and irradiating the laser beam onto a processed substrate 105 through a window 104 constituted by quartz. The optical system 112, the mirror 103 and the cylindrical lens 116 are shown in FIG. 8.

Figure 8:
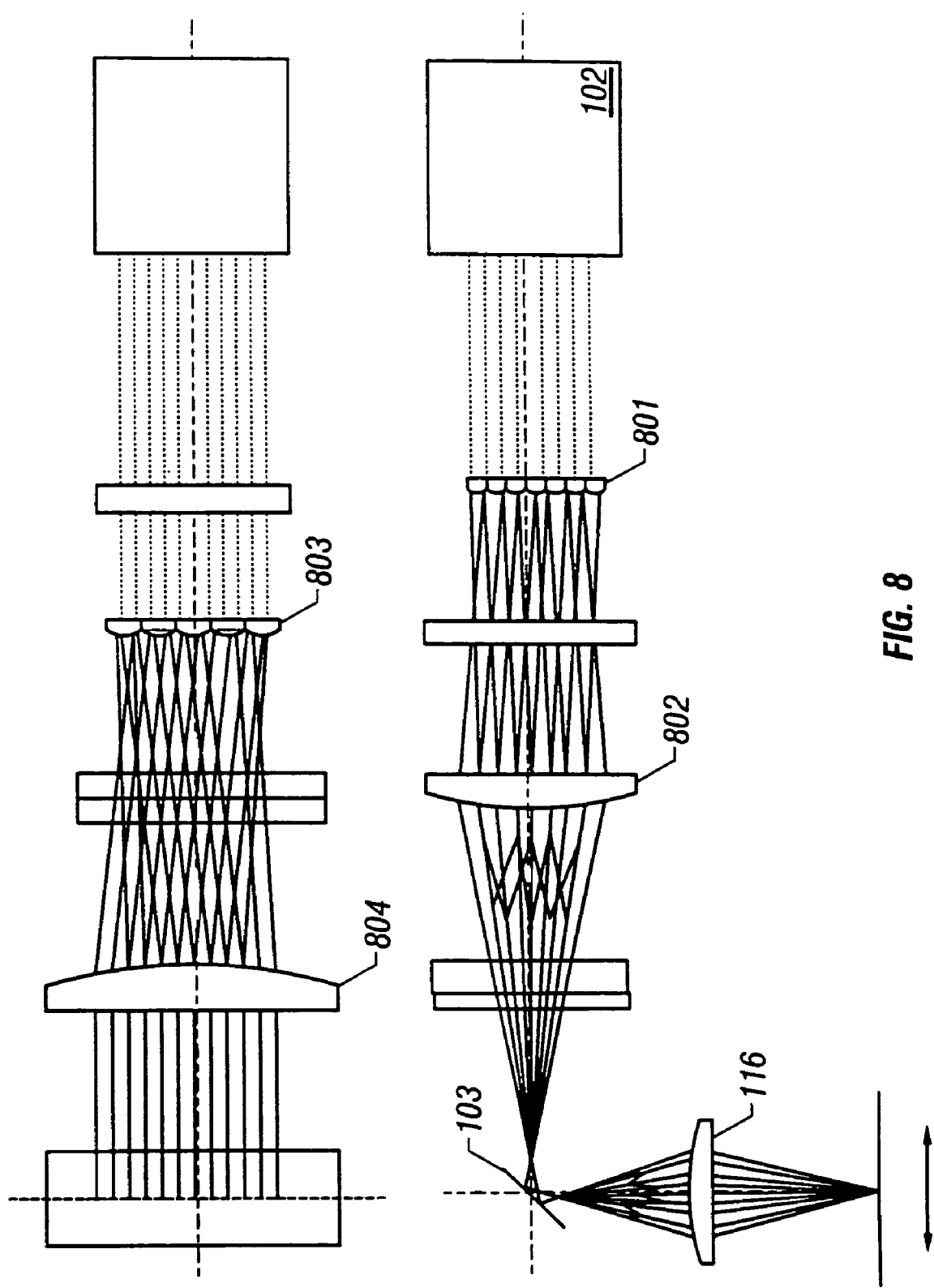
FIG. 8 is a view snowing an optical system for forming a linear laser according to an embodiment.
Figure 9A:
FIGS. 9(A), 9(B) are photographs of a scanning type electron microscope photographing a surface of a silicon film which has been subjected to laser irradiation in an atmosphere at room temperature or a state where a temperature of a substrate is elevated to 400° C. in respect of a substrate where hydrogen terminations are intentionally provided on a surface of an amorphous silicon film.
Figure 9B:

The optical system of FIG. 8 is used since the homogeneity of energy distribution in the linear beam face is very excellent. The dispersion of energy is within ±5%. The linear laser beam used in the present invention is fabricated in a linear shape by the optical system of FIG. 8. Although the linear laser beam may be fabricated by an optical system different from that in FIG. 8, the homogeneity of the energy distribution must be substantially the same as that of FIG. 8. The role of a group of lenses of the type of FIG. 8 will be described below. Incidentally, in FIG. 8, the upper view is a top view and the lower view is a side view.

Groups of cylindrical lenses 801 and 803 serve to divide a beam lengthwisely and breadthwisely. Cylindrical lenses 802 and 804 serve to condense divided light fluxes to one region or a region forming a linear shape according to the present invention. In this embodiment, the energy distribution of a beam is averaged by gathering into one beam divided into 35 divisions formed by dividing an original beam into 5 divisions breadthwisely and 7 divisions lengthwisely. A ratio of a lengthwise length to a breadthwise length of a beam can freely be changed in view of the structure of the groups of lenses and therefore, all the shapes of beam from a square shape to a linear shape can be formed by the optical system. However, the shape of beam that is easy to fabricate is restricted by combinations of sizes and focal distances of lenses.

The quartz window 104 is fixed by a jig 113 incorporating a heater 115. The heater 115 is attached for defogging the quartz window 104. The reason is that the laser irradiation chamber 101 is brought into a humidified state in irradiating laser. For an O-ring 114 of the quartz window, baiton is used. The heat resistant temperature of baiton is about 150° C. which is sufficient for the present invention. However, when a higher heat resistant temperature is requested, the O-ring 114 stands about 250° C. by using karuretsu. Dry nitrogen may be blown to the quartz window 104 for the defogging operation.

In this embodiment, the laser oscillating device 102 oscillates XeCl excimer laser (wavelength 308 nm) Otherwise, KrF excimer laser (wavelength 248 nm) may be used.

The processed substrate 105 is arranged or a stage 111 installed on a base 106. The base 106 incorporates a heater for maintaining the temperature of the substrate on the stage 111 at a predetermined temperature. The base 106 is moved in a direction orthogonal to the line direction of a linear laser beam by a moving mechanism 107 and enables a laser beam to irradiate the upper face of the processed substrate 105 while scanning the laser beam.

The laser irradiation chamber 101, the atmosphere of which can be controlled is provided with a vacuum exhaust pump 108 as decompressing and exhausting means. Further, the embodiment is provided with a gas supply tube 109 connected to a nitrogen bomb via a valve and a gas supply tube 110 for adjusting the humidity of the laser processing chamber via a valve as gas supplying means. Nitrogen, humidity of which is controlled is appropriate as a gas supplied from the gas supply tube 110.

The laser irradiation chamber 101 is connected to a substrate transfer chamber 302 (FIG. 3) via a gate valve 301.

In FIG. 3, the laser irradiation chamber 101 of FIG. 1 is connected to the substrate transfer chamber 302 via the gate valve 301.

An explanation will be given of the device shown by FIG. 3. A cassette 304 where a number of sheets of the processed substrates 105, for example, 20 sheets thereof are incorporated, is arranged in a load/unload chamber 306. One sheet of the substrate is moved from the cassette 304 to an alignment chamber by a robot arm 305.

An alignment mechanism for modifying a positional relationship between the processed substrate 105 and the robot arm 305 is arranged in the alignment chamber 303.

The alignment chamber 303 is connected to the load/unload chamber 306 via a gate valve 307.

The substrate is brought to the substrate transfer chamber 302 by the robot arm 305 and is further transferred to the laser irradiation chamber 101 by the robot arm 305. In this case, the stage 111 is maintained at a desired temperature, for example, in a range from room temperature to about 300° C. by the heater in the base 106. The substrate arranged on the stage is left until the temperature is stabilized. At this moment, the temperature of the quartz window 104 is elevated to pertinent temperature by a heater 115 in the jig 113 for defogging. Further, nitrogen gas and nitrogen gas, the humidity of which is adjusted are flown from the gas supply tubes 109 and 110 for controlling the atmosphere, mainly the humidity of the laser irradiation chamber.

In FIG. 1, dimensions of a linear laser beam irradiated on the processed substrate 105 are width 0.4 mm×length 135 mm. The energy density of the laser beam at the irradiated surface falls in a range of 100 mJ/cm$^2$ through 500 mJ/cm$^2$, for example, 260 mJ/cm$^2$. By moving the base 106 at the speed of 1.2 mm/s in one direction, the linear laser beam is scanned. The oscillation frequency of laser is set to 30 Hz and in respect of one point of an irradiated object, 10 through 50 shots of laser beam is irradiated.

In this case, the moisture in the laser irradiation chamber serves as a temperature holding layer of the silicon film and significantly promotes homogeneity of crystallization. When laser crystallization process is performed in a state where the processed substrate 105 is rinsed and dried before irradiation of laser, moisture adsorbing and remaining on the surface of the silicon film helps promote the effect of maintaining the temperature of the substrate. According to the present invention, the moisture adsorbing and remaining on the surface of the silicon film is also defined as a portion of the temperature holding layer.

When the temperature of the substrate is excessively high, the diffusion rate of the layer of water molecules becomes excessively high by which the temperature maintaining effect is attenuated. An excellent result is obtained when temperature of the substrate falls in a range of −10° C. through 100° C. Also in respect of the pressure of the laser irradiation chamber, an excellent result is obtained by controlling the balance of supply and exhaust of gases under any pressure where the pressure is changed from several hundreds pascal to several atom.

After finishing the laser irradiation, the processed substrate 105 is returned to the substrate transfer chamber 302 by the robot arm 305. The processed substrate 105 is transferred to the load/unload chamber 306 by the robot arm 305 and is incorporated in the cassette 304.

In this way, laser annealing step is finished. By repeating the step in this way, a number of the substrates can be processed continuously one by one.

Although the linear laser has been used according to the embodiment, even when all the beam shapes of the linear shape to the square shape are used in the present invention, the effect featured by the present invention is obtained.

Embodiment 2

The films A, B and C fabricated in Embodiment 1 are crystallized in this embodiment. Or, the crystalline performance is promoted.

According to the embodiment, steps substantially the same as those in Embodiment 1 are carried out. The only difference resides in the kinds of gases supplied to the laser irradiation chamber. In this embodiment, the gas supply tube 109 for supplying oxygen diluted by nitrogen via a valve and the gas supply tube 110 for supplying hydrogen diluted by nitrogen via a valve, are provided. The concentration of hydrogen is set to a range of 0.1% through 10% in consideration of safety. The concentration of oxygen is also set to a range of 0.1% through 10% in compliance with hydrogen.

After creating an atmosphere of the laser chamber mainly constituted by nitrogen, oxygen and hydrogen by using the gas supply tubes and the like, laser irradiation is carried out. A layer of water molecules formed by reacting and synthesizing oxygen and hydrogen in the laser irradiation chamber by laser energy, serves as a temperature holding layer of the silicon film and significantly promotes the homogeneity of crystallization. When the laser crystallization is performed in a state where the processed substrate 105 is rinsed and dried before laser irradiation, moisture adsorbing and remaining on the surface of the silicon film helps promote the effect of maintaining the temperature of the substrate. According to the present invention, moisture adsorbing and remaining on the surface of the silicon film is also defined as a portion of the temperature holding layer.

When the temperature of the substrate is excessively high, the diffusion rate of the layer of water molecules becomes excessively high which the temperature holding effect is attenuated. An excellent result is obtained when the temperature of the substrate falls in a range of −10° C. through 100° C. In respect of the pressure in the laser irradiation chamber, an excellent result is also contained by controlling the balance of supply and exhaust of cases under any pressure where the pressure is changed from several hundreds pascal to several atom.

Embodiment 3

Figure 5:
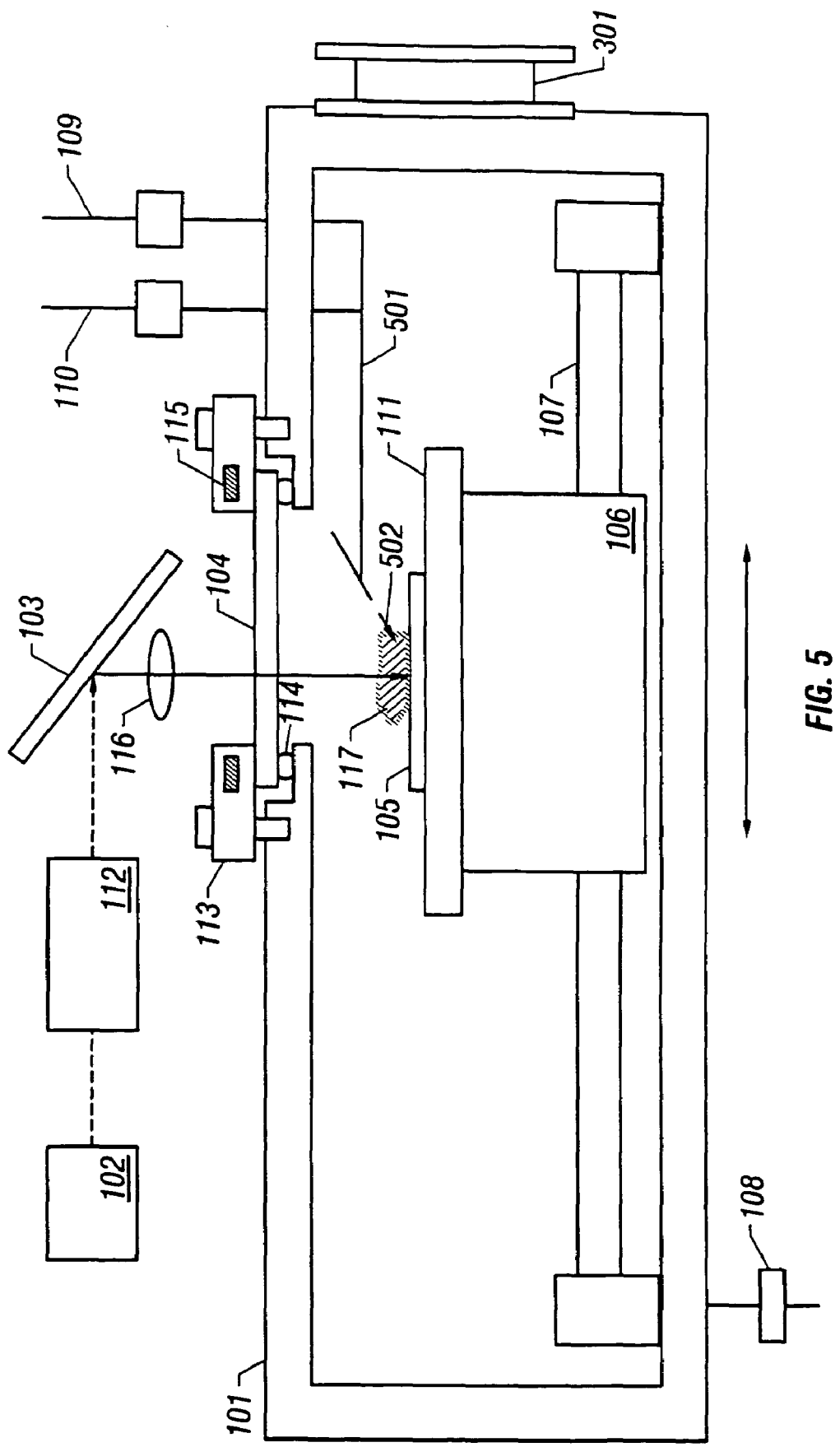
FIG. 5 is a view showing a laser irradiation chamber according to an embodiment.

The films A, B and C fabricated in Embodiment 1 are crystallized in this embodiment. Or, the crystalline performance is promoted. A device shown in FIG. 5 is used in this embodiment.

Steps substantially the same as those in Embodiment 1 are carried out according to the embodiment. The only difference resides in the method of supplying gases supplied to the laser irradiation chamber. According to the embodiment, an extension tube 501 is connected to the gas supply tube 109 and the gas supply tube 110 and a gas 502 flown from the gas supply tubes 109 and 110 is blown from the extension tube 501. The extension tube 501 is installed such that the gas 502 is supplied to entire portion of the substrate to which the laser beam is irradiated.

According to the embodiment, the gas 502 is nitrogen, the humidity of which is adjusted. Water molecules in the gas 502 serve as the temperature holding layer of the silicon film and significantly promotes the homogeneity of crystallization. When laser crystallization is carried out in a state where the processed substrate 105 is rinsed and dried before laser irradiation, moisture adsorbing and remaining on the surface of the silicon film helps promote the effect of maintaining the temperature of the substrate. According to the present invention, moisture adsorbing and remaining on the surface of the silicon film is defined as a portion of the temperature holding layer.

When the temperature of the substrate is excessively high, the diffusion rate of the layer of water molecules becomes excessively high by which the temperature holding effect is attenuated. An excellent result is obtained when the temperature of the substrate falls in a range of −10° C. through 100° C. In respect of the pressure of the laser irradiation chamber, an excellent result is obtained by controlling the balance of supply and exhaust of gases under any pressure where the pressure is changed from several hundreds pascal to several atom.

It is known from the result of the embodiment that the effect of the embodiment is not dependent on the presence or absence of the laser irradiation chamber. The effect of laser irradiation chamber only resides in prevention of contamination of the substrate.

Figure 6:
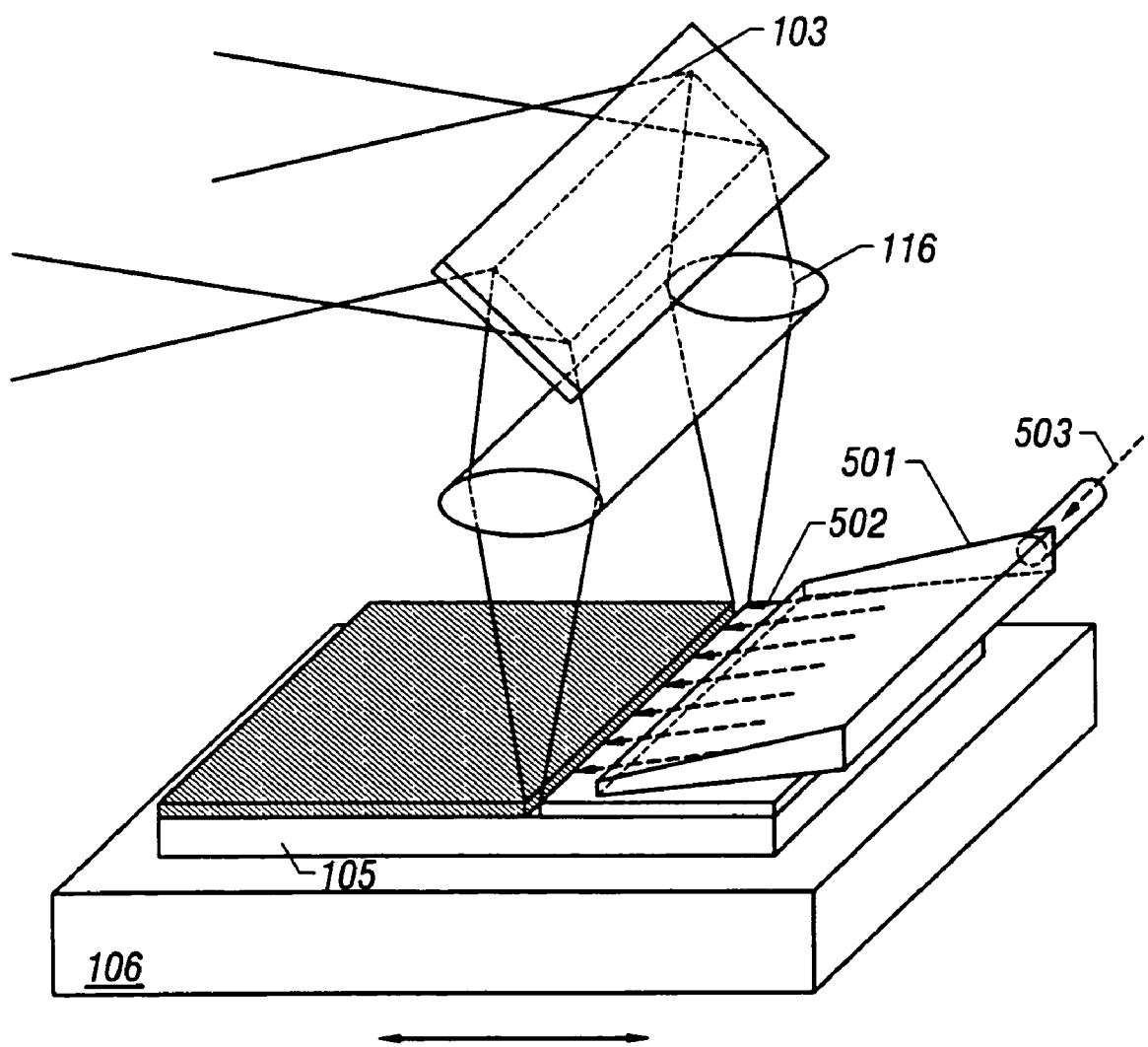
FIG. 6 is a view showing a laser irradiation chamber according to an embodiment.
Figure 7A:
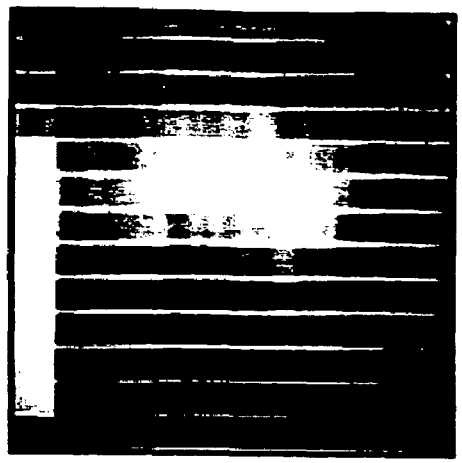
FIGS. 7(A), 7(B) and 7(C) are photographs each showing a thin film of silicon which has been subjected to laser crystallization by a linear laser.
Figure 7B:
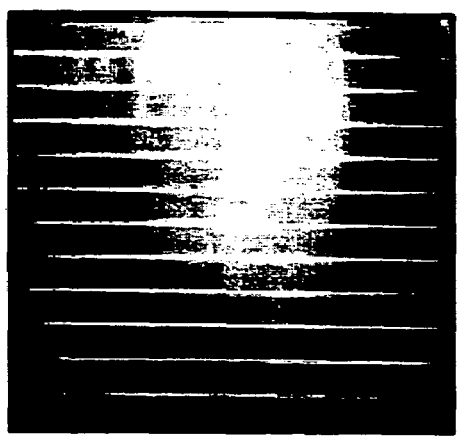
Figure 7C:

When the laser beam used in the embodiment is formed in a linear shape, the shape of a blowing port of the gas extension tube 501 is made linear in compliance with the shape of the laser beam and gases are blown to the substrate in a shape of an air knife, the gas 502 can be supplied efficiently (refer to FIG. 6). A gas flow 503 shows a behavior of gas flow in the gas extension tube 501.

Embodiment 4

The films A, B and C formed in Embodiment 1 are crystallized in this embodiment. Or, the crystalline performance is promoted.

Steps substantially the same as those in Embodiment 3 are carried out in this embodiment. The only difference resides in the kinds of gases supplied to the laser irradiation chamber. In this embodiment, similar to Embodiment 2, the gas supply tube 109 for supplying oxygen diluted by nitrogen via a valve and the gas supply tube 110 for supplying hydrogen diluted by nitrogen via a valve are provided. The concentration of hydrogen is set to a range of 0.1% through 10% in consideration of safety. The concentration of oxygen also falls in a range of 0.1% through 10% in compliance with hydrogen.

In the case of the embodiment, the gas 502 is a mixture gas of nitrogen, oxygen and hydrogen. A layer of water molecules formed by reacting and synthesizing oxygen and hydrogen by laser energy, serves as the temperature holding layer of the silicon film and significantly promotes the homogeneity of crystallization. When laser crystallization is carried out in a state where the processed substrate 105 is rinsed and dried before laser irradiation, the moisture adsorbing and remaining on the surface of the silicon film helps promote the effect of maintaining the temperature of the substrate. According to the present invention, the moisture adsorbing and remaining on the surface of the silicon film is defined also as the temperature holding layer.

When the temperature of the substrate is excessively high, the diffusion rate of the layer of water molecules becomes excessively high by which temperature holding effect is attenuated. An excellent result is obtained when the temperature of the substrate falls in a rage of −10° C. through 100° C. In respect of the pressure in the laser irradiation chamber, an excellent result is obtained by controlling the balance of supply and exhaust of gases under any pressure where the pressure is changed from several hundreds pascal to several atom.

It is known from the result of the embodiment that the effect of the embodiment is not dependent on the presence or absence of the laser irradiation chamber. The effect of the laser irradiation chamber is only prevention of contamination of the substrate. However, there is a danger in discharging hydrogen to the atmosphere and therefore, the laser irradiation chamber must be provided in the case of the embodiment.

When the laser beam used in the embodiment is made linear, the shape of a blowing port of the gas extension tube 501 is also made linear in compliance with the shape of the laser beam and cases are blown to the substrate in a shape of an air knife, the gas 502 can be supplied further efficiently. (Refer to FIG. 6) The gas flow 503 shows a behavior of gas flow in the gas extension tube 501.

Embodiment 5

Laser annealing is carried out by using an excimer laser in order to crystallize non single crystal silicon films A, B and C, the method of fabrication of which is shown in Embodiment 1 or further promoting the crystalline performance.

An explanation will be given of steps of performing laser annealing by using the devices shown by FIG. 1 and FIG. 3. Firstly, the processed substrate 105 (substrate having non single crystal silicon film) is cleaned by an aqueous solution of HF or an aqueous solution of a mixture of HF and $H_2O_2$ by which the surface of the silicon film is terminated by hydrogen and thereafter, the processed substrate 105 is incorporated in the cassette 304 and the cassette 304 is arranged in the load/unload chamber 306.

In FIG. 3, according to the embodiment, the processed substrate 105 transferred from load/unload chamber 306 is aligned and thereafter, transferred to the laser irradiation chamber 101.

The processed substrate 105 transferred to the laser irradiation chamber 101 is mounted on the stage 111. The gate valve 301 is closed in the state, and the inside of the laser irradiation chamber is evacuated by the vacuum exhaust pump 108.

Thereafter, oxygen diluted by nitrogen is supplied from the gas supply tube 109 and hydrogen diluted by nitrogen is supplied from the supply tube 110, respectively and an atmosphere, for example constituted by oxygen 5%; hydrogen 5% and nitrogen 90% is produced. In this case, the pressure is set to the atmospheric pressure.

Further, in FIG. 1, dimensions of a linear laser beam irradiated onto the processed substrate 105 are set to width 0.4 mm×length 135 mm. The energy density of the laser beam at the irradiated face is set to a range of 100 mJ/cm$^2$ through 500 mJ/cm$^2$, for example, 260 mJ/cm$^2$. The linear laser beam is scanned by moving the base 106 at a speed of 1.2 mm/s in one direction. Oscillation frequency of the laser is set to 30 Hz and in respect of one point of an irradiated object, 10 through 50 shots of laser beam are irradiated.

In this case, oxygen in the laser chamber and hydrogen in the laser chamber or hydrogen atoms on the surface of the non single crystal silicon film are reacted by the laser energy by which water molecules are formed. The aggregation of water molecules serves to maintain the temperature of the non single crystal silicon film, helps promote crystallization and significantly promotes the homogeneity of crystalline performance. The processed substrate 105 is cleaned by a aqueous solution of HF or an aqueous solution of a mixture of HF and $H_2O_2$ before laser irradiation and therefore, there is provided the moisture adsorbing and remaining on the surface of the silicon film by which the effect of maintaining the temperature of the substrate is promoted. According to the present invention, the moisture adsorbing and remaining on the surface of the silicon film is defined also as a portion of the temperature holding layer. The higher the temperature of the substrate, the higher the diffusion rate of the aggregation of water molecules by which temperature holding effect is attenuated. In this way, laser annealing is performed in respect of the non single crystal silicon films A, B and C whereby the crystallization is caused or the crystalline performance is promoted.

In respect of the atmosphere in the laser chamber of the embodiment, when the hydrogen concentration is changed in a range of 0.1% through 10%, the oxygen concentration is changed in a range of 0.1% through 10% and the pressure in the laser processing chamber is changed from several hundreds pascal to several atoms and the temperature of the substrate is changed from −10° C. to 100° C., an excellent result is obtained under any atmosphere. Even in an atmosphere which does not include hydrogen, water is formed so far as the atmosphere includes oxygen and therefore, the laser crystallization is effective also in an atmosphere which does not include hydrogen and includes oxygen. Thereafter, the substrate is incorporated to the cassette 304 of the load/unload chamber 306 via the robot arm 305.

Embodiment 6

Figure 10A:
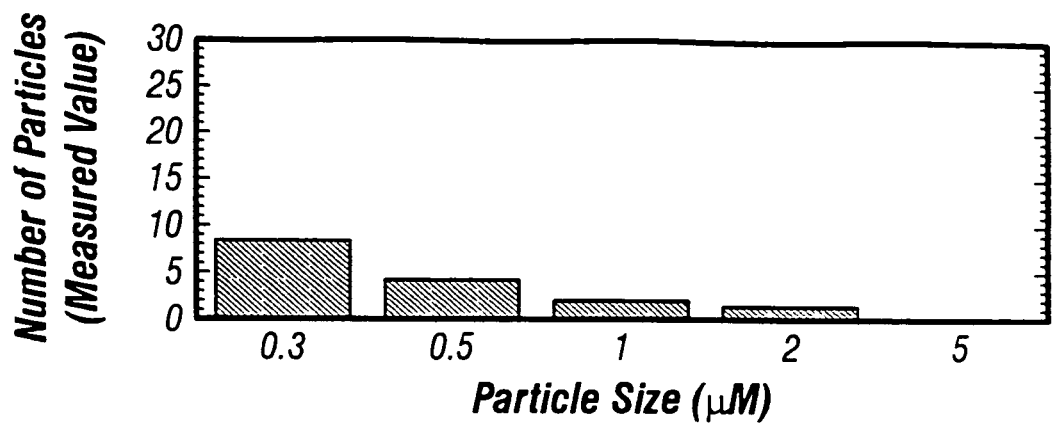
FIGS. 10(A) and 10(B) are graphs showing a number of dusts detected by a dust counter before and after a laser processing in a laser irradiation chamber.
Figure 10B:
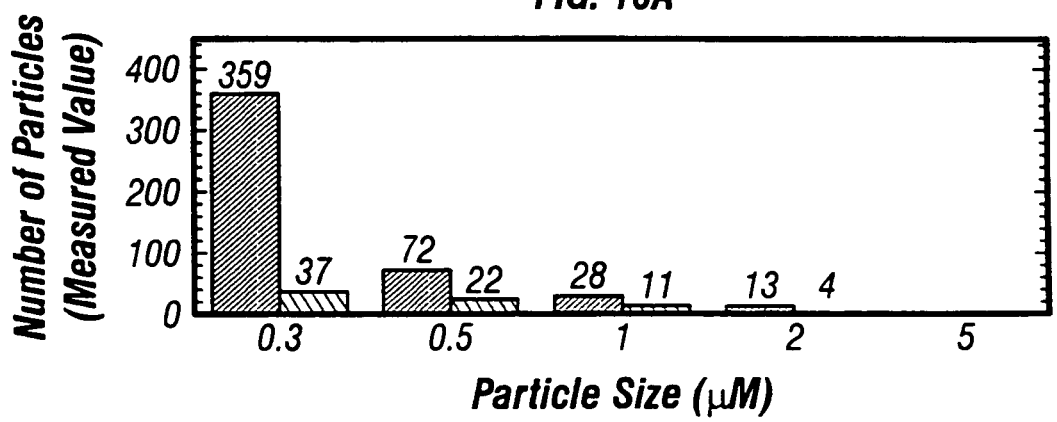

In this embodiment, a proof of forming water molecules by laser irradiation will be shown. FIGS. 10(A) and 10(B) are formed by counting a number of dusts in the laser irradiation chamber by a dust counter where the abscissa designates a particle size (μm) and the ordinate designates a number of particles (measured value). FIG. 10(A) indicates the number of particles before laser irradiation. (The total number is 16. The sampling time period is 2' 06".) FIG. 10(B) indicates a number of particles after performing laser irradiation while scanning the substrate (netted ones, the total number is 473) and the number of particles counted after only scanning the substrate without laser irradiation (ones hatched in the right downward direction, the total number is 74). (The sampling time period is 1' 39".) It is known that the counted value of the dust counter is significantly increased by the laser irradiation.

Figure 11:
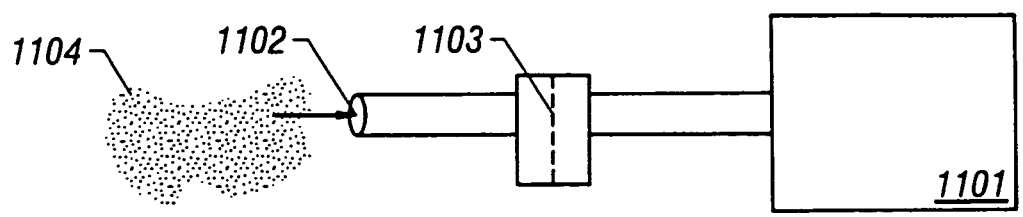
FIG. 11 is a view showing the dust counter and a filter according to the embodiment.

A majority of the particles detected by the dust counter after laser irradiation are provided with a particle size of about 0.3 μm. Hence, the inventors have inserted a filter 1103 having a pitch of 0.2 μm at the midway of an intake port 1102 of a dust counter 1101 and tried to catch particles 1104 after laser irradiation. (refer to FIG. 11)

After laser irradiation, the filter is observed by an SEM. However, almost no particles have been observed. In view of the fact, it can be predicted that particles detected by the dust counter have been liquid particles. It is predicted that the liquid formed by laser irradiation is constituted by water in consideration of the object of laser irradiation.

According to the present invention, compared with all the conventional laser annealing technologies, the crystalline performance, the homogeneity are significantly promoted and the efficiency of using energy can considerably be promoted.

What is claimed is:

1. A method for forming a semiconductor film comprising:
    forming a semiconductor film over a substrate;
    cleaning a surface of the semiconductor film by an aqueous solution comprising HF; and
    forming a gas flow which comprises an oxygen gas and blows to a portion of said semiconductor film substantially in one direction while irradiating a laser light to said portion of said semiconductor film after said cleaning.

2. A method according to claim 1 wherein said substrate is maintained at a temperature of −10 to 100° C. during said irradiating of said laser light.

3. A method according to claim 1 wherein said laser light is a linear laser light.

4. A method according to claim 1 wherein said laser light has an energy density of 100 to 500 mJ/cm$^2$.

5. A method according to claim 1 wherein said gas flow is formed in a chamber capable of controlling an atmosphere thereof, and said irradiating of said laser light is conducted in said chamber.

6. A method according to claim 1 wherein said semiconductor film comprises silicon.

7. A method according to claim 1 wherein said semiconductor film is crystallized by said irradiating of said laser light.

8. A method according to claim 1 wherein crystalline performance of said semiconductor film is promoted by said irradiating of said laser light.

9. A method according to claim 2 wherein said laser light has a spot shape.

10. A method for forming a semiconductor film comprising:

forming a semiconductor film over a substrate;

cleaning a surface of the semiconductor film by an aqueous solution comprising HF; and forming a gas flow which comprises an oxygen gas and blows from a blowing port to a portion of said semiconductor film substantially in one direction while irradiating a laser light to said portion of said semiconductor film after said cleaning.

11. A method according to claim 10 wherein said substrate is maintained at a temperature of −10 to 100° C. during said irradiating of said laser light.

12. A method according to claim 10 wherein said laser light is a linear laser light.

13. A method according to claim 10 wherein said laser light has an energy density of 100 to 500 mJ/cm$^2$.

14. A method according to claim 10 wherein said gas flow is formed in a chamber capable of controlling an atmosphere thereof, and said irradiating of said laser light is conducted in said chamber.

15. A method according to claim 10 wherein said semiconductor film comprises silicon.

16. A method according to claim 10 wherein said semiconductor film is crystallized by said irradiating of said laser light.

17. A method according to claim 10 wherein crystalline performance of said semiconductor film is promoted by said irradiating of said laser light.

18. A method according to claim 10 wherein said laser light has a spot shape.

19. A method for forming a semiconductor film comprising:

forming a semiconductor film over a substrate;

cleaning a surface of the semiconductor film by an aqueous solution comprising HF; and blowing a gas flow comprising an oxygen gas in an air knife shape to a portion of said semiconductor film while irradiating a laser light to said portion of said semiconductor film after said cleaning.

20. A method according to claim 19 wherein said substrate is maintained at a temperature of −10 to 100° C. during said irradiating of said laser light.

21. A method according to claim 19 wherein said laser light is a linear laser light.

22. A method according to claim 19 wherein said laser light has an energy density of 100 to 500 mJ/cm$^2$.

23. A method according to claim 19 wherein said gas flow is formed in a chamber capable of controlling an atmosphere thereof, and said irradiating of said laser light is conducted in said chamber.

24. A method according to claim 19 wherein said semiconductor film comprises silicon.

25. A method according to claim 19 wherein said semiconductor film is crystallized by said irradiating of said laser light.

26. A method according to claim 19 wherein crystalline performance of said semiconductor film is promoted by said irradiating of said laser light.

27. A method according to claim 19 wherein said laser light has a spot shape.

* * * * *